United States Patent [19]
Kotera et al.

[11] Patent Number: 5,166,553
[45] Date of Patent: Nov. 24, 1992

[54] CURRENT MIRROR CIRCUIT EMPLOYING DEPLETION MODE FETS

[75] Inventors: Nobuo Kotera, Kokubunji; Kiichi Yamashita, Kanagawa; Hirotoshi Tanaka, Yamanashi; Satoshi Tanaka, Kokubunji; Yasushi Hatta; Minoru Nagata, both of Kodaira, all of Japan

[73] Assignee: Hitachi, Ltd., Tokyo, Japan

[21] Appl. No.: 364,461

[22] Filed: Jun. 12, 1989

[30] Foreign Application Priority Data

Jun. 20, 1988 [JP] Japan .................. 63-150282

[51] Int. Cl.⁵ .............................. H03K 17/16
[52] U.S. Cl. .................... 307/448; 307/450; 307/264; 307/546; 307/547; 307/548
[58] Field of Search ........ 307/443, 448, 450, 263-264, 307/546-548; 330/257, 288

[56] References Cited

U.S. PATENT DOCUMENTS 4,926,071 5/1990 MacMillan et al. ............. 307/450

FOREIGN PATENT DOCUMENTS 0203384 12/1980 European Pat. Off. ........... 307/450

OTHER PUBLICATIONS

Conf. on Solid State devices, Tokyo, 1974, "Logic Circuits with Zum Gate Schottky Barrier FETs" Suzuki et al., pp. 219-224.
"Analysis and Design of Analog Integrated Circuit" Zud ed. (1984), John Wiley & Sons, Inc. pp. 709-718.

Primary Examiner—Janice A. Howell
Assistant Examiner—M. Wambach
Attorney, Agent, or Firm—Antonelli, Terry, Stout & Kraus

[57] ABSTRACT

A semiconductor circuit including first and second FET's for delivering an output signal without being affected by a change in threshold voltage of the FET's is disclosed. According to one practical form of the semiconductor circuit, the drain-source current path of an additional FET whose gate and source are shorted to each other, is connected in parallel to the drain-source current path of the first FET whose gate and drain are shorted to each other, to make the voltage-current characteristic of the second FET agree with that of the parallel combination of the first and additional FET's. According to another practical form of the semiconductor circuit, a voltage dividing circuit is connected in parallel to the drain-source current path of the first FET, and a divided output voltage from the voltage dividing circuit is applied between the gate and source of each of the first and second FET's.

21 Claims, 4 Drawing Sheets

CURRENT MIRROR CIRCUIT EMPLOYING DEPLETION MODE FETS

BACKGROUND OF THE INVENTION

The present invention relates to a semiconductor circuit including field effect transistors (hereinafter referred to as "FET's"), and more particularly to a semiconductor circuit whose electrical characteristics are independent of the threshold voltage of FET's, included in an integrated circuit (hereinafter referred to as "IC"), making up the semiconductor circuit. Further, the present invention relates to a signal processing system using the above semiconductor circuit.

A current source circuit using FET's is explained on pages 709 through 718 of a text book entitled "Analysis and Design of Analog Integrated Circuit" second Edition, published in 1984 by John Wiley & Sons, Inc.

A current source circuit of this kind is called "current mirror circuit", and has first and second FET's and input, common and output nodes. In more detail, the drain-source current path of the first FET is connected between the input node and the common node, the drain-source current path of the second FET is connected between the output node and the common node, and the gate of the first FET and the gate of the second FET are connected to each other, to be shorted to the drain of the first FET.

Further, each of the first and second FET's is of the enhancement type, and the gate of the first FET is shorted to the drain thereof. When the gate-source voltage of the first FET exceeds the threshold voltage thereof, the first FET operates in a saturation region. Further, when a voltage applied between the output node and the common node is sufficiently high, the second FET operates in a saturation region.

An input current to the above current mirror circuit flows through the drain-source current path of the first FET, to generate the gate-source voltage of the first FET. This gate-source voltage is applied between the gate and source of the second FET. Thus, in a case where the second FET is equal in threshold voltage and effective device area to the first FET, an output current equal to the input current flows through the drain-source current path of the second FET.

Further, in a case where the effective device area of the second FET is twice larger than that of the first FET, the output current is twice larger than the input current.

As mentioned above, when a predetermined input current is supplied to the input node of the current mirror circuit, an output current proportional to the input current flows through the output node. This operation is analogous to the reflection of light from a mirror. Hence, a current source circuit of this kind is called "current mirror circuit".

SUMMARY OF THE INVENTION

In recent years, a semiconductor circuit made up of depletion-type FET's has been widely used in high-speed devices using GaAs FET's.

As has been already mentioned, when the gate of an enhancement-type FET is shorted to the drain thereof, the FET can operate in a saturation region. Meanwhile, when the gate of a depletion-type FET is shorted to the drain thereof, the depletion-type FET operates in a linear region. The present inventors have confirmed that when a semiconductor circuit such as the above-mentioned current mirror circuit is made up of depletion-type FET's, the electrical characteristics of the semiconductor circuit largely depend on the threshold voltage of the depletion-type FET's.

For example, in a current mirror circuit made up of depletion-type FET's, an output current is dependent not only on an input current but also on the threshold voltage of the FET's. The threshold voltage of an FET is deviated greatly from a design target value by various factors such as the manufacturing process and the variation of temperature. When the threshold voltage is deviated from the design target value, the output current of the current mirror circuit deviates from a design target value, and thus the electrical characteristics (such as power consumption) of an IC including the current mirror circuit are also deviated from target values.

The present invention has been made on the basis of the above study, and it is a main object of the present invention to provide a semiconductor circuit whose electrical characteristics are hardly affected by a change in threshold voltage of FET's used.

Further, it is another object of the present invention to provide a signal processing system having differential pair of transistors and a current mirror circuit, in which system the output signal current of the differential pair of transistors and the power consumption of the system are substantially independent of a change in threshold voltage of the FET's being used.

In order to attain the main object of the present invention, according to a first practical form of an inventive semiconductor circuit, the drain-source current path of the first FET whose gate and drain are shorted to each other, is connected in parallel to the drain-source current path of an additional FET whose gate and source are shorted to each other.

Further, in order to attain the main object of the present invention, according to a second practical form of an inventive semiconductor circuit, a voltage dividing circuit is connected in parallel to the drain-source current path of the first FET, and a divided output voltage from the voltage dividing circuit is applied between the gate and source of each of the first and second FET's.

In order to attain another object of the present invention, according to one practical form of an inventive signal processing system, an operating current of the differential pair transistors is set by the current mirror circuit, and one of the first and second practical forms mentioned above is used as the current mirror circuit.

Now, let us suppose that the first and additional FET's included in the first practical form are of the depletion type. Then, the current flowing through the drain-source current path of the first FET whose gate and drain are shorted to each other, is determined by the voltage vs. current characteristic in the linear region. Meanwhile, the gate of the additional FET is shorted to the source thereof, that is, the gate-source voltage $V_{GS}$ of the additional FET is equal to zero. Hence, the current flowing through the drain-source current path of the additional FET is determined by the voltage vs. current characteristic in a saturation region corresponding to $V_{GS}=0$.

Accordingly, a current flowing through the parallel combination of the first and additional FET's is the sum of the current flowing through the first FET and the current flowing through the additional FET. This sum current becomes equal to a current flowing through the drain-source path of a depletion type FET which is considered to operate in a saturation region and to have a gate-source voltage dependent upon this sum current and the threshold voltage thereof in spite of a short-connection of the gate and drain of this depletion type FET.

That is, the voltage vs. current characteristic of the parallel combination of the first and additional FET's agrees with the voltage vs. current characteristic of the second depletion-type FET which is equal in threshold voltage to the first and additional FET's and is operated in a saturation region. Thus, the electrical characteristics of the first practical form of an inventive semiconductor circuit are hardly affected (i.e., are substantially unaffected) by a change in threshold voltage of the FET's.

Next, let us suppose that each of first and second FET's included in the second practical form of a semiconductor circuit according to the present invention is of the depletion type.

A relatively large voltage developed across the voltage dividing circuit is applied between the drain and source of the first FET and a relatively small divided output voltage from the voltage dividing circuit is applied between the gate and source of the first FET. Hence, even if the threshold voltage $V_{th}$ of the first FET has a negative value, the first FET will operate in a saturation region.

Further, the divided output voltage from the voltage dividing circuit is also applied between the gate and source of the second FET so that the second FET operates in a saturation region. Accordingly, in a case where the second FET is equal in threshold voltage to the first FET, the voltage vs. current characteristic of the first FET agrees with that of the second FET. Thus, the electrical characteristics of the second practical form of an inventive semiconductor circuit are hardly affected (i.e., are substantially unaffected) by a change in threshold voltage of the FET's.

According to one practical form of an inventive signal processing system, when the input current to the current mirror circuit is set very precisely, the output current of the current mirror circuit is set very precisely, without being affected by a change in threshold voltage of FET's. The output current of the current mirror circuit serves as that operating current of the differential pair of transistors which flows through the source coupling node or emitter coupling node of the differential pair transistors. Thus, the output signal current flowing through a drain or collector of the differential pair of transistors and the power consumption of the signal processing system can be made substantially independent of a change in threshold voltage of FET's.

DESCRIPTION OF THE PREFERRED EMBODIMENTS

Embodiment I

Figure 1:
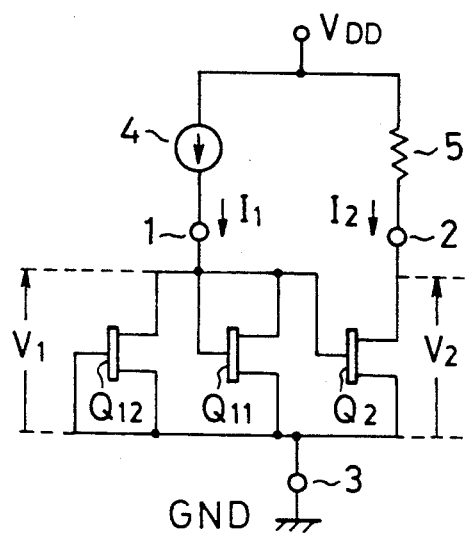
FIGS. 1 to 11 are circuit diagrams showing first to eleventh embodiments of a current mirror circuit according to the present invention.

FIG. 1 is a circuit diagram showing a first embodiment of a current mirror circuit according to the present invention. As shown in FIG. 1, the present embodiment has an input node 1, an output node 2 and a common node 3, and further includes N-channel, depletion-type FET's $Q_{11}$, $Q_{12}$ and $Q_2$, which serve as the first, additional and second FET's or, alternatively, as the first, second and third FET's, respectively.

The FET's $Q_{11}$, $Q_{12}$ and $Q_2$ are, for example, MESFET's (namely, metal semiconductor field effect transistors) which are formed in a GaAsIC in close proximity to one another. These MESFET's can operate in the same manner as MOSFET's. The FET's $Q_{11}$, $Q_{12}$ and $Q_2$ have the same threshold voltage $V_{th}$, the same gate length $L_G$ and the same width $W_G$. It is to be noted that the threshold voltage $V_{th}$ has a negative value.

Referring to FIG. 1, the gate and drain of the first FET $Q_{11}$, the gate of the second FET $Q_2$, and the drain of the additional FET $Q_{12}$ are connected to the input node 1. Further, the source of the first FET $Q_{11}$, the source of the second FET $Q_2$, and the gate and source of the additional FET $Q_{12}$ are connected to the common node 3.

The common node 3 is applied with a ground potential GND, and the input node 1 is connected to a power source having a positive supply voltage $V_{DD}$ through a constant current source 4 for supplying an input current. The output node 2 is connected to the power source having the supply voltage $V_{DD}$ through a resistor 5, which acts as a load. The constant current source 4 may be replaced by a resistor.

The present embodiment is different from the conventional current mirror circuit in that the additional FET $Q_{12}$ whose gate and source are shorted to each other, is connected between the input node 1 and the common node 3.

The circuit operation of the present embodiment will be explained below in detail. Now, let us express the voltage applied between the input node 1 and the common node 3, the current flowing through the input node 1, and the current flowing through the output node 3 by $V_1$, $I_1$ and $I_2$, respectively. Then, the gate-source voltage $V_{GS11}$ of the first depletion-type FET $Q_{11}$ whose gate and drain are shorted to each other, is equal to the voltage $V_1$ and the drain-source voltage $V_{DS11}$ of the first FET $Q_{11}$ is equal to $V_1$. Thus, the gate-source voltage $V_{GS11}$, the drain-source voltage $V_{DS11}$, and the threshold voltage $V_{th}$ having a negative value, satisfy the following relation:

$$V_{GS11} - V_{th} > V_{DS11}$$

Thus, the first FET $Q_{11}$ operates in a linear region (that is, triode region).

Accordingly, a current $I_{11}$ flowing through the drain-source current path of the first FET $Q_{11}$ is given by the following equation:

$$I_{11} = KV_{DS11}\{2(V_{GS11} - V_{th}) - V_{DS11}\} \quad (1)$$
$$= KV_1(V_1 - 2V_{th})$$
$$= K(V_1^2 - 2V_{th}V_1)$$

where K is a channel constant which is proportional to the gate width $W_G$ of the first transistor $Q_{11}$ and is inversely proportional to the gate length $L_G$ thereof.

When the input current $I_1$ has a sufficiently large value, the voltage $V_1$ applied between the common node 3 and the input node 1 becomes sufficiently large. Thus, the gate-source voltage $V_{GS12}$ (=0) of the additional FET $Q_{12}$ whose gate and source are shorted to each other, the threshold voltage $V_{th}$ having a negative value, and the drain-source voltage $V_{DS12}$ (=$V_1$) of the additional FET $Q_{12}$ satisfy the following relation:

$$V_{GS12} - V_{th} < V_{DS12}$$

Hence, the additional FET $Q_{12}$ operates in a saturation region (namely, pentode region).

Accordingly, a current $I_{12}$ flowing through the drain-source current path of the additional FET $Q_{12}$ is given by the following equation:

$$I_{12} = K(V_{GS12} - V_{th})^2 \qquad (2)$$
$$= K V_{th}^2$$

The current $I_1$ flowing through the parallel combination of the first FET $Q_{11}$ and the additional FET $Q_{12}$ is the sum of the current $I_{11}$ and the current $I_{12}$. From the equations (1) and (2), we can obtain the current $I_1$ as follows:

$$I_1 = I_{11} + I_{12}$$
$$= K(V_1 - V_{th})^2$$

Thus, the voltage $V_1$ is given by the following equation:

$$V_1 = \sqrt{\frac{I_1}{K}} + V_{th} \qquad (3)$$

Meanwhile, a voltage $V_2$ applied between the common node 3 and the output node 2, the above-mentioned voltage $V_1$, and the threshold voltage $V_{th}$ having a negative value satisfy the following relation:

$$V_1 - V_{th} < V_2$$

Hence, the second FET $Q_2$ operates in a saturation region (namely, pentode region). Accordingly, the current $I_2$ flowing through the drain-source current path of the second FET $Q_2$ is given by the following equation:

$$I_2 = I(V_{GS2} - V_{th})^2 \qquad (4)$$
$$= K(V_1 - V_{th})^2$$

By substituting the equation (3) in the equation (4), we can obtain the following equation:

$$I_2 = K\left(\sqrt{\frac{I_1}{K}} + V_{th} - V_{th}\right)^2 \qquad (5)$$
$$= I_1$$

As is evident from the above explanation, the additional FET $Q_{12}$ is connected in parallel to the first FET $Q_{11}$, and hence the gate-source voltage $V_1$ of the first FET $Q_{11}$ is dependent upon the input current $I_1$ and the threshold voltage $V_{th}$ as indicated by the equation (3). The voltage vs. current characteristic of the parallel combination of the first FET $Q_{11}$ and the additional FET $Q_{12}$ expressed by the equation (3) agrees with the voltage vs. current characteristic of the second FET $Q_2$ which is equal in threshold voltage to the FET's $Q_{11}$ and $Q_{12}$ and operates in the saturation region, as shown in the equations (4) and (5). Accordingly, the current flowing through the drain-source current path of the second FET $Q_2$, that is, the output current $I_2$ of the current mirror circuit is equal to the input current $I_1$. In other words, the output current $I_2$ is determined by the input current $I_1$ and is independent of the threshold voltage $V_{th}$. In a case where the channel constant of the second FET $Q_2$ is different from that of the FET's $Q_{11}$ and $Q_{12}$, the output current $I_2$ is determined by the input current $I_1$ and the channel constant K of these FET's.

For example, in a case where the gate width of the second FET $Q_2$ is N times larger than the gate width of the first FET $Q_{11}$ and the additional FET $Q_{12}$, the output current $I_2$ is given by the following equation:

$$I_2 = NI_1 \qquad (6)$$

Meanwhile, the operation limit of the present embodiment is determined by a maximum value $V_f$ of the gate voltage, at which the first FET $Q_{11}$ and the second FET $Q_2$ can perform a transistor action normally, and is given by the following formula:

$$0 < V_1 < V_f$$

In a case where each of the FET's $Q_{11}$, $Q_{12}$ and $Q_2$ is a GaAs MESFET, the voltage $V_f$ is considered to be a gate voltage, at which a forward current begins to flow through the Schottky junction at the gate of the MESFET, and is about 600 mV. In a case where each of the FET's $Q_{11}$, $Q_{12}$ and $Q_2$ is a silicon MOSFET, the voltage $V_f$ is considered to be the break-down voltage of a gate insulating film, or a gate voltage, at which an abnormal characteristic is caused by hot electrons. As mentioned above, in a case where the GaAs MESFET is used, the allowable gate voltage in the forward direction is less than 600 mV, that is, is limited within a narrow range.

Even in a case where the threshold voltage $V_{th}$ of the FET's $Q_{11}$, $Q_{12}$ and $Q_2$ is changed from a negative value to a positive value, that is, these FET's are N-channel enhancement-type FET's having the same threshold voltage, the present embodiment can operate as a normal current mirror circuit, for the following reason. In this case, the additional FET $Q_{12}$ whose gate and source are shorted to each other, is turned off, and the first FET $Q_{11}$ and the second FET $Q_2$ operate in a saturation region as in the conventional current mirror circuit.

Hence, the output current $I_2$ equal to $NI_1$ can be obtained.

Embodiment II

Figure 2:
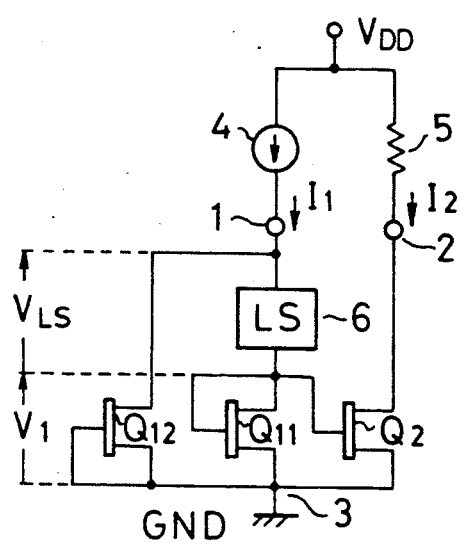

FIG. 2 is a circuit diagram showing a second embodiment of a current mirror circuit according to the present invention. The present embodiment is different from the embodiment of FIG. 1 in that a level shift circuit 6 is connected between the input node 1 and the drain of the first FET $Q_{11}$, that is, between the drain of the additional FET $Q_{12}$ and the drain of the first FET $Q_{11}$, and is identical with the embodiment of FIG. 1 in other points. Referring to FIG. 2, the voltage $V_1$ between the level shift circuit 6 and ground is applied to the drain of the first FET $Q_{11}$. Hence, the voltage $V_1$ applied to the drain of the first FET $Q_{11}$ is relatively small, and thus the first FET $Q_{11}$ operates surely in a linear region. Meanwhile, the voltage between the input node 1 and ground, that is, a voltage $V_{LS}+V_1$ is applied to the drain of the additional FET $Q_{12}$. Thus, the drain of the additional FET $Q_{12}$ is applied with a relatively large voltage, and the second FET $Q_{12}$ operates surely in a saturation region.

Accordingly, the equations (1) to (5) which have been explained in the EMBODIMENT I, hold for the present embodiment. Thus, the output current $I_2$ of the present embodiment is determined by the input current $I_1$ and the channel constant K, and is independent of a change in threshold voltage $V_{th}$.

The level shift circuit 6 for generating the level shift voltage $V_{LS}$ may be formed of one of a resistor, a Schottky barrier diode connected in a forward direction, an FET whose gate and drain are shorted to each other, and a combination of these circuit elements.

Further, a level shift circuit similar to the level shift circuit 6 may be connected between the output node 2 and the drain of the second FET $Q_2$.

Embodiment III

Figure 3:
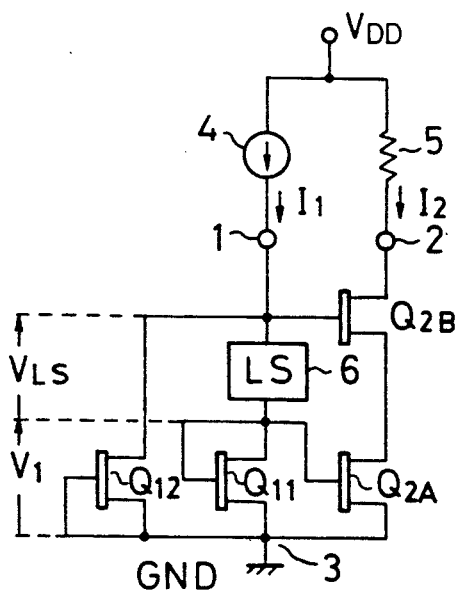

FIG. 3 is a circuit diagram showing a third embodiment of a current mirror circuit according to the present invention. The present embodiment is different from the embodiment of FIG. 2 in that two FET's $Q_{2A}$ and $Q_{2B}$ which are connected in cascade and are equal in threshold voltage to the FET's $Q_{11}$ and $Q_{12}$, are used in place of the second FET $Q_2$ of FIG. 2, one and the other ends of the level shift circuit 6 are connected to the gate of the FET $Q_{2B}$ and the gate of the FET $Q_{2A}$, respectively, and the voltage $V_{LS}$ between one and the other ends of the level shift circuit 6 is made larger than the voltage $V_1$.

Owing to the series combination of FET's $Q_{2A}$ and $Q_{2B}$ connected between the output node 2 and the common node 3, a high breakdown voltage operation is performed between the output node 2 and the common node 3. That is, even when the voltage of the output node 2 is greatly increased, the voltage at the source of the FET $Q_{2B}$ increases only a little, and thus the output current $I_2$ flowing through the drain-source current path of the FET $Q_{2A}$ is kept substantially constant.

The reason why the level shift voltage $V_{LS}$ appearing across the level shift circuit 6 is made larger than the voltage $V_1$, will be explained in detail in the following EMBODIMENT IV.

Embodiment IV

Figure 4:
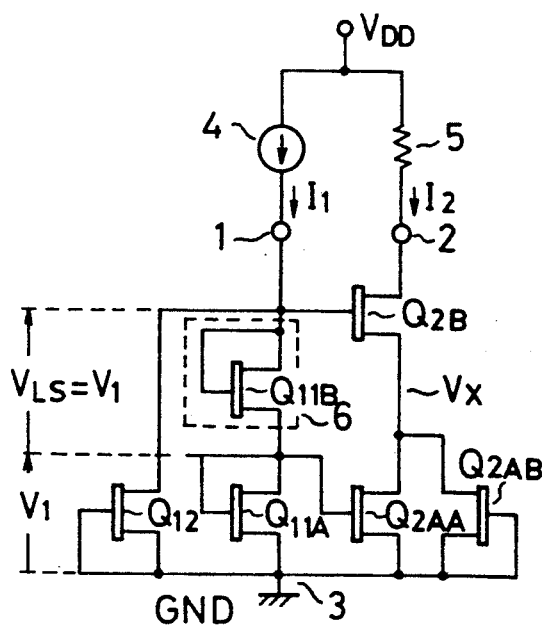

FIG. 4 is a circuit diagram showing a fourth embodiment of a current mirror circuit according to the present invention. Reffering to FIG. 4, FET's $Q_{12}$, $Q_{11A}$, $Q_{11B}$, $Q_{2AA}$ and $Q_{2B}$ are N-channel, depletion-type FET's having the same threshold voltage $V_{th}$. The threshold voltage $V_{th}$ has a negative value.

The present embodiment is different from the embodiment of FIG. 3 in that the FET $Q_{11B}$ whose gate and drain are shorted to each other, is used as the level shift circuit 6, the FET's $Q_{11A}$ and $Q_{2AA}$ are used in place of the FET's $Q_{11}$ and $Q_{2A}$ of FIG. 3, respectively, the drain-source current path of the FET $Q_{2AB}$ whose gate and source are shorted to each other, is connected in parallel to the drain-source current path of the FET $Q_{2AA}$, and the level shift voltage $V_{LS}$ appearing across the level shift circuit 6 is made equal to the voltage $V_1$. The present embodiment is identical with the embodiment of FIG. 3 in other points.

At first, let us consider a case where the FET $Q_{2AB}$ is omitted from the present embodiment.

The FET's $Q_{11A}$ and $Q_{11B}$ have the same threshold voltage $V_{th}$, the same gate width $W_G$ and the same gate length $L_G$, and a current $I_{11A}$ flowing through the drain-source current path of the FET $Q_{11A}$ is equal to a current $I_{11B}$ flowing through the drain-source current path of the FET $Q_{11B}$. Accordingly, the level shift voltage $V_{LS}$ appearing across the level shift circuit 6 is equal to the voltage $V_1$.

Further, the equations (1) to (3) hold for the present embodiment. Thus, the level shift voltage $V_{LS}$ is given by the following equation:

$$V_{LS} = V_1 = \sqrt{\frac{I_1}{K}} + V_{th} \quad (7)$$

Now, let us suppose that each of the series-connected FET's $Q_{2AA}$ and $Q_{2B}$ operates in a saturation region. Then, the current $I_2$ flowing through the drain-source current path of the FET $Q_{2AA}$ is given by the following equation:

$$\begin{aligned} I_2 &= K(V_{GS2AA} - V_{th})^2 \\ &= K(V_1 - V_{th})^2 \end{aligned} \quad (8)$$

By substituting the equation (7) in the equation (8), we can obtain a relation $I_1 = I_2$.

Since the current $I_2$ equal to the current $I_1$ flows through the drain-source current path of the FET $Q_{2B}$, the gate-source voltage $V_{GS2B}$ of the FET $Q_{2B}$ can be obtained from the following equation:

$$I_2 = K(V_{GS2B} - V_{th})^2 = I_1 \quad (9)$$

From the equations (9), (7) and (8), we can obtain the following equation:

$$\begin{aligned} V_{GS2B} &= V_{GS2AA} = V_{LS} = V_1 \\ &= \sqrt{\frac{I_1}{K}} + V_{th} \end{aligned} \quad (10)$$

The source voltage $V_x$ of the FET $Q_{2B}$ can be obtained from the gate-source voltage $V_{GS2B}$ thereof in the following manner:

$$\begin{aligned} V_x &= V_1 + V_{LS} - V_{GS2B} \\ &= \sqrt{\frac{I_1}{K}} + V_{th} \\ &= V_{GS2B} = V_{GS2AA} = V_{LS} = V_1 \end{aligned}$$

Since the threshold voltage $V_{th}$ has a negative value, an inequality $V_{GS2AA} - V_{th} > V_x$ holds for this case, and thus the FET $Q_{2AA}$ cannot operate in a saturation region. That is, the FET $Q_{2AA}$ is obliged to operate in a linear region.

In other words, when the level shift voltage $V_{LS}$ generated by the level shift circuit 6 is so set as to be equal to the voltage $V_1$, the FET $Q_{2AA}$ does not operate in the saturation region but operates in the linear region. Thus, the equations (9) and (10) do not hold, and the current $I_2$ differs from the current $I_1$.

According to the present embodiment, in order to solve the above problem, the drain-source current path of the FET $Q_{2AB}$ whose gate and source are shorted to each other, is connected in parallel to the drain-source current path of the FET $Q_{2AA}$. A current $I_{2A}$ flowing through the parallel combination of the FET's $Q_{2AA}$ and $Q_{2AB}$ is the sum of a current $I_{2AA}$ flowing through the FET $Q_{2AA}$ and a current $I_{2AB}$ flowing through the FET $Q_{2AB}$.

Since the gate-source voltage $V_{GS2AA}$ of the FET $Q_{2AA}$ is equal to the voltage $V_1$ and the drain-source voltage $V_{DS2AA}$ thereof is equal to the voltage $V_x$ ($=V_1$), the FET $Q_{2AA}$ operates in the linear region. Accordingly, the current $I_{2AA}$ flowing through the FET $Q_{2AA}$ is given by the following equation:

$$I_{2AA} = K(V_1^2 - 2V_{th}V_1) \tag{11}$$

The FET $Q_{2AB}$ whose gate and source are shorted to each other, operates in a saturation region. Accordingly, the current $I_{2AB}$ flowing through the FET $Q_{2AB}$ is given by the following equation:

$$\begin{aligned} I_{2AB} &= K(V_{GS2AB} - V_{th})^2 \\ &= KV_{th}^2 \end{aligned} \tag{12}$$

Thus, the current $I_{2A}$ flowing through the parallel combination of the FET's $Q_{2AA}$ and $Q_{2AB}$ is obtained by substituting the equations (11) and (12) in an equation $I_{2A} = I_{2AA} + I_{2AB}$, and by using the equation (7). That is, the current $I_{2A}$ is given by the following equation:

$$\begin{aligned} I_{2A} &= K(V_1 - V_{th})^2 \\ &= K\left(\sqrt{\frac{I_1}{K}} + V_{th} - V_{th}\right)^2 \\ &= I_1 \end{aligned} \tag{13}$$

In a case where the drain-source voltage $V_{DS2B}$ of the FET $Q_{2B}$ has a sufficiently large value, the FET $Q_{2B}$ operates in a saturation region. Thus, the current $I_2$ flowing through the FET $Q_{2B}$ is given by the equation (8), and is equal to the current $I_1$.

In order to make the current $I_2$ twice larger than the current $I_1$, the gate width $W_G$ of the FET's $Q_{2B}$, $Q_{2AA}$ and $Q_{2AB}$ is made twice larger than that of the FET's $Q_{11A}$, $Q_{11B}$ and $Q_{12}$.

Embodiment V

Figure 5:
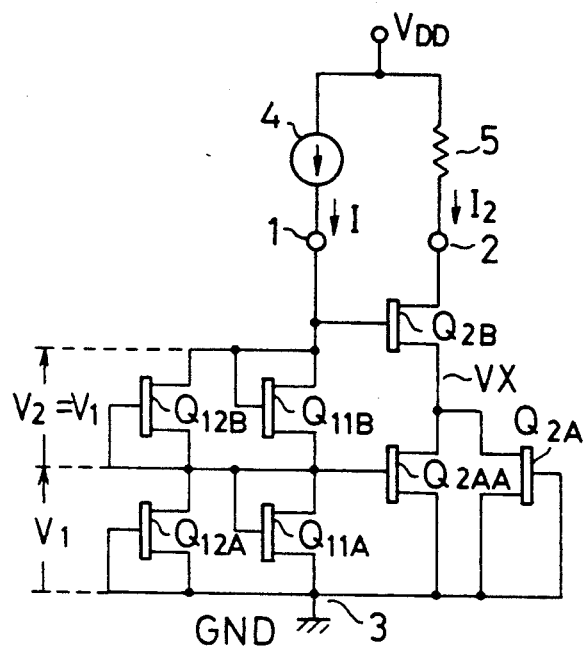

FIG. 5 is a circuit diagram showing a fifth embodiment of a current mirror circuit according to the present invention. FET's $Q_{12A}$, $Q_{12B}$, $Q_{11A}$, $Q_{11B}$, $Q_{2AA}$, $Q_{2AB}$ and $Q_{2B}$ shown in FIG. 5 are N-channel, depletion-type MESFET's which are formed in a GaAs IC in close proximity to one another, and have the same threshold voltage $V_{th}$, the same gate length $L_G$ and the same gate width $W_G$.

The present embodiment is different from the embodiment of FIG. 4 in that the FET $Q_{11A}$ whose gate and drain are shorted to each other, is connected in parallel to the FET $Q_{12A}$ whose gate and source are connected to each other, the FET $Q_{11B}$ whose gate and drain are shorted to each other, is connected in parallel to the FET $Q_{12B}$ whose gate and source are shorted to each other, and the parallel combination of the FET's $Q_{11A}$ and $Q_{12A}$ is connected in series with the parallel combination of the FET's $Q_{11B}$ and $Q_{12B}$. The present embodiment is identical with the embodiment of FIG. 4 in the remaining circuit connection other than the above-mentioned and in the circuit operation with respect to the remaining circuit connection.

Embodiment VI

Figure 6:
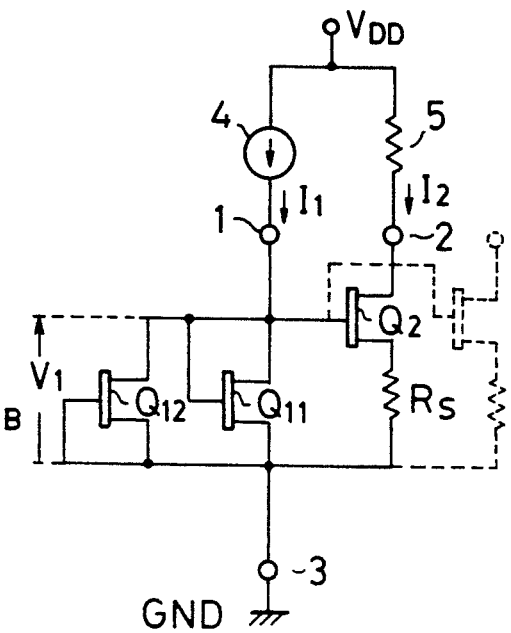

FIG. 6 is a circuit diagram showing a sixth embodiment of a current mirror circuit according to the present invention. The present embodiment is different from the embodiment of FIG. 1 in that a source resistor $R_S$ is connected between the source of the FET $Q_2$ and the common node 3, and is identical with the embodiment of FIG. 1 in the remaining circuit connection other than the above-mentioned.

The equations (1) to (3) hold for the present embodiment. Meanwhile, the gate-source voltage $V_{GS2}$ of the FET $Q_2$ whose source is connected to the source resistor $R_S$, is equal to $V_2 - R_S I_2$, and the FET $Q_2$ operates in a saturation region. Thus, the current $I_2$ is given by the following equation:

$$\begin{aligned} I_2 &= K(V_{GS2} - V_{th})^2 \\ &= K(V_1 - R_S I_2 - V_{th})^2 \end{aligned} \tag{14}$$

By substituting the equation (3) in the equation (14), the current $I_2$ can be given by the following equation:

$$I_2 = K\left(\sqrt{\frac{I_1}{K}} - R_S I_2\right)^2 \tag{15}$$

By solving the equation (15), we can obtain the following equation:

$$\sqrt{I_2} = \frac{1}{2R_S\sqrt{K}}\left(\sqrt{1 + 4R_S\sqrt{KI_1}} - 1\right) \tag{16}$$

In a case where the source resistor $R_S$ has a sufficiently small resistance value, we can obtain the following formula:

$$\sqrt{1 + 4R_S\sqrt{KI_1}} \approx 1 + 2R_S\sqrt{KI_1}$$

Accordingly, the equation (16) is rewritten as follows:

$$I_2 \approx I_1$$

In a case where the source resistor $R_S$ has a sufficiently large resistance value, we can obtain the following formula:

$$\sqrt{1 + 4R_s\sqrt{KI_1}} \approx 2\sqrt{R_s\sqrt{KI_1}}$$

Accordingly, the equation (16) is rewritten as follows:

$$I_2 \approx \frac{1}{R_s}\sqrt{\frac{I_1}{K}} \tag{17}$$

As is evident from the above explanation, when the source resistor $R_s$ having a large resistance value is used, the present embodiment can operate as a minute constant current source circuit.

When an FET and a source resistor which are indicated by dotted lines in FIG. 6, are added to the present embodiment, the present embodiment can operate as a multi-current mirror circuit for producing a plurality of output currents.

This multi-current mirror circuit is not made up of bi-polar transistors which cannot neglect a base current, but is made up of FET's which can neglect a gate current. Accordingly, the relation between the input current $I_1$ and the input voltage $V_1$ is determined only by the threshold voltage $V_{th}$ and the channel constant K of the parallel-connected FET's $Q_{11}$ and $Q_{12}$, in spite of the fact that a plurality of output currents are obtained.

Further, the output currents of the above multicurrent mirror circuit can be set independently of each other by making the resistance values of a plurality of source resistors different from each other. Hence, it is not required to make FET's on the output side different in gate width from each other.

In the present embodiment, the output current is stabilized by the voltage feedback due to the source resistor $R_s$. That is, a change in output current due to variations in drain voltage of the FET $Q_2$ is reduced.

Embodiment VII

Figure 7:
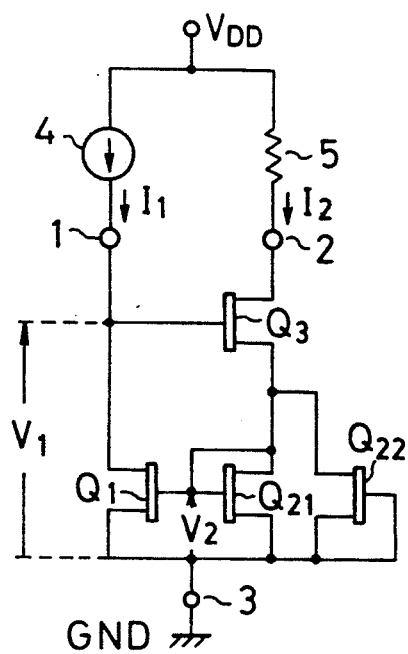

FIG. 7 is a circuit diagram showing a seventh embodiment of a current mirror circuit according to the present invention. FET's $Q_1$, $Q_{21}$, $Q_{22}$ and $Q_3$ shown in FIG. 7 are N-channel, depletion-type MESFET's or MOSFET's which are formed in an IC in close proximity to one another, and have the same threshold voltage $V_{th}$, the same gate length and the same gate width. The threshold voltage $V_{th}$ has a negative value. As shown in FIG. 7, the input node 1 is connected to the drain of the FET $Q_1$ and the gate of the FET $Q_3$, the output node 2 is connected to the drain of the FET $Q_3$, and the grounded common node 3 is connected to the source of the FET $Q_1$, the source of the FET $Q_{21}$ and the gate and source of the FET $Q_{22}$. Further, the gate of the FET $Q_1$ is connected to the gate and drain of the FET $Q_{21}$, the drain of the FET $Q_{22}$ and the source of the FET $Q_3$. In other words, the gate of the FET $Q_{21}$ is shorted to the drain thereof, the gate of the FET $Q_{22}$ is shorted to the source thereof, and the parallel combination of the FET's $Q_{21}$ and $Q_{22}$ is connected between the source of the FET $Q_3$ and the common node 3.

Since the FET $Q_{21}$ has the negative threshold voltage $V_{th}$ and the gate of the FET $Q_{21}$ is shorted to the rain thereof, the FET $Q_{21}$ operates in a linear region. When the gate-source voltage of the FET $Q_{21}$ is expressed by $V_2$, a current $I_{21}$ flowing through the FET $Q_{21}$ is given by the following equation:

$$I_{21} = I(V_2^2 - 2V_{th}V_2) \tag{18}$$

In a case where the voltage $V_2$ has a relatively large value, the FET $Q_{22}$ operates in a saturation region since the threshold voltage has a negative value, and the gate of the FET $Q_{22}$ is shorted to the source thereof. Hence, a current $I_{22}$ flowing through the FET $Q_{22}$ is given by the following equation:

$$\begin{aligned} I_{22} &= K(V_{GS22} - V_{th})^2 \\ &= KV_{th}^2 \end{aligned} \tag{19}$$

Since the FET's $Q_{21}$ and $Q_{22}$ operate in the linear and saturation regions, respectively, it is desirable to connect the level shift circuit 6 of FIG. 2 between the drain of the FET $Q_{22}$ and the gate and drain of the FET $Q_{21}$.

The current $I_2$ flowing through the parallel combination of the FET's $Q_{21}$ and $Q_{22}$ is the sum of the current $I_{21}$ and the current $I_{22}$. By using the equations (18) and (19), we can obtain the following equation:

$$\begin{aligned} I_2 &= I_{21} + I_{22} \\ &= K(V_2 - V_{th})^2 \end{aligned}$$

Thus, the voltage $V_2$ is given by the following equation:

$$V_2 = \sqrt{\frac{I_2}{K}} + V_{th} \tag{20}$$

When a sufficiently large voltage is applied between the drain and source of the FET $Q_3$, the FET $Q_3$ operates in a saturation region, and the current $I_2$ flowing through the drain-source current path of the FET $Q_3$ is given by the following equation:

$$I_2 = K(V_{GS3} - V_{th})^2 \tag{21}$$

From the equations (20) and (21), we can obtain the gate-source voltage $V_{GS3}$ of the FET $Q_3$ as follows:

$$V_{GS3} = V_2 = \sqrt{\frac{I_2}{K}} + V_{th} \tag{22}$$

Since the drain-source voltage $V_1$ of the FET $Q_1$ is the sum of the voltage $V_2$ and the voltage $V_{GS3}$, the voltage $V_1$ is given by the following equation:

$$\begin{aligned} V_1 &= V_2 + V_{GS3} = 2V_2 \\ &= 2\left(\sqrt{\frac{I_2}{K}} + V_{th}\right) \end{aligned} \tag{23}$$

In a case where a relation $V_2 - V_{th} < V_1$ is satisfied among the drain-source voltage $V_1$ given by the equation (23), the gate-source voltage $V_2$ given by the equation (20), and the threshold voltage $V_{th}$ having a negative value, that is, in a case where the voltages $V_1$, $V_2$ and $V_{th}$ satisfy the following relation:

$$\sqrt{\frac{I_2}{K}} < 2\left(\sqrt{\frac{I_2}{K}} + V_{th}\right)$$

the FET $Q_1$ operates in a saturation region, and the input current $I_1$ flowing through the drain-source current path of the FET $Q_1$ is given by the following equation:

$$I_1 = K(V_2 - V_{th})^2 \qquad (24)$$

By substituting the equation (20) in the equation (24), we can obtain the following equation:

$$I_1 = K\left(\sqrt{\frac{I_2}{K}} + V_{th} - V_{th}\right)^2 \qquad (25)$$
$$= I_2$$

That is, the output current $I_2$ is equal to the input current $I_1$.

Even when the threshold voltage $V_{th}$ is changed from a negative value to a positive value, and thus the FET's $Q_1$, $Q_{21}$, $Q_{22}$ and $Q_3$ are N-channel, enhancement-type FET's having the same positive threshold voltage, the circuit configuration of FIG. 7 can operate normally as a current mirror circuit. In this case, the FET $Q_{22}$ whose gate and source are shorted to each other, is turned off, and each of the FET's $Q_1$, $Q_{21}$ and $Q_3$ operates in a saturation region. Thus, like the circuit configuration of FIG. 1, the circuit configuration of FIG. 7 can produce the output current $I_2$ equal to $NI_1$.

The operation limit of the present embodiment is determined by a maximum value $V_f$ of the gate voltage, at which the FET's $Q_1$ and $Q_{21}$ can perform a transistor action normally, and is given by the following formula:

$$0 < V_2 < V_f$$

The voltage $V_f$ is determined in the same manner as in the embodiment of FIG. 1.

Embodiment VIII

Figure 8:
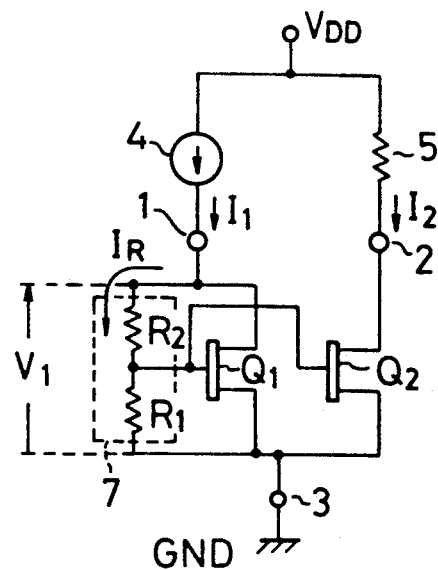

FIG. 8 is a circuit diagram showing an eighth embodiment of a current mirror circuit according to the present invention. FET's $Q_1$ and $Q_2$ shown FIG. 8 are N-channel, depletion-type MESFET's or MOSFET's which are formed in an IC in close proximity to each other, and have the same threshold voltage $V_{th}$, the same gate length and the same gate width. The threshold voltage $V_{th}$ has a negative value.

Referring to FIG. 8, a voltage dividing circuit 7 is connected between the input node 1 and the common node 3, and a divided voltage from the voltage dividing circuit 6 is applied to the gate of each of the FET's $Q_1$ and $Q_2$. The voltage dividing circuit 7 is formed of, for example, a series combination of two resistors $R_1$ an and $R_2$. Further, the input node 1 is connected to the drain of the FET $Q_1$, the output node 2 is connected to the drain of the FET $Q_2$, and the common node 3 is connected to the source of each of the FET's $Q_1$ and $Q_2$.

Now, let us express the voltage diving ratio of the circuit 7 by a and express the voltage appearing across the circuit 7 by $V_1$. Then, the voltage appearing across the resistor $R_1$ is given by $aV_1$. Since each of the resistors $R_1$ and $R_2$ has a very large resistance value, a current $I_R$ flowing through the voltage dividing circuit 7 is negligibly small, as compared with the current $I_1$ flowing through the drain-source current path of the FET $Q_1$.

When a relation $V_{GS1} - V_{th} < V_{DS1}$ is satisfied among the gate-source voltage $V_{GS1}$ of the FET $Q_1$ equal to $aV_1$, the threshold voltage $V_{th}$ having a negative value, and the drain-source voltage $V_{DS1}$ of the FET $Q_1$ equal to the voltage $V_1$, the FET $Q_1$ operates in a saturation region, and the input current $I_1$ flowing through the drain-source current path of the FET $Q_1$ is given by the following equation:

$$I_1 = K(V_{GS1} - V_{th})^2 \qquad (26)$$

The gate-source voltage $V_{GS1}$ of the FET $Q_1$ is equal to the gate-source voltage of the FET $Q_2$ In a case where the drain-source voltage of the FET $Q_2$ has a sufficiently large value, the FET $Q_2$ operates in a saturation region, and the output current $I_2$ flowing through the drain-source current path of the FET $Q_2$ is equal to the input current $I_1$ as indicated by the following equation:

$$I_2 = K(V_{GS1} - V_{th})^2 \qquad (27)$$
$$= I_1$$

In a case where the gate width of the FET $Q_2$ is N times larger than that of the FET $Q_1$, the output current $I_2$ is given by the following equation:

$$I_2 = NI_1$$

Even when the threshold voltage $V_{th}$ in the present embodiment is changed from a negative value to a positive value, that is, even when the FET's $Q_1$ and $Q_2$ of FIG. 8 are N-channel, enhancement-type FET's having the same positive threshold voltage, the circuit configuration of FIG. 8 can operate normally as a current mirror circuit. This is because each of the FET's $Q_1$ and $Q_2$ operates in a saturation region. Thus, the output current $I_2$ equal to $NI_1$ can be obtained.

The operation limit of the present embodiment is determined by a maximum value $V_f$ of the gate voltage, at which each of the FET's $Q_1$ and $Q_2$ can perform a transistor action normally, and is given by the following formula:

$$0 < V_{GS1} < V_f$$

The voltage $V_f$ is determined in the same manner as in the embodiment of FIG. 1.

Embodiment IX

Figure 9:
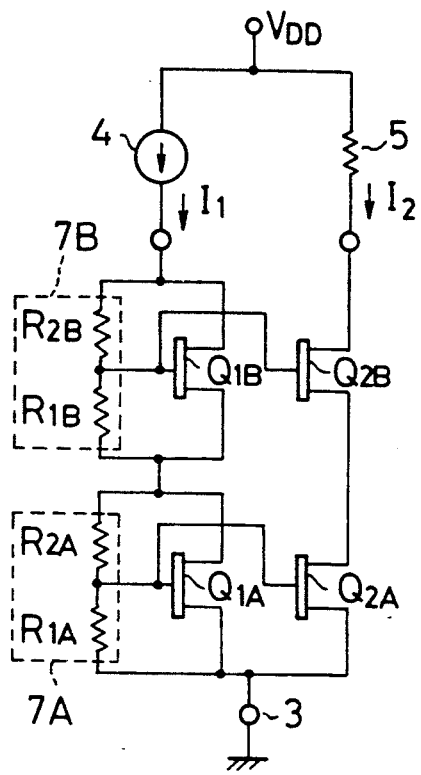

FIG. 9 is a circuit diagram showing a ninth embodiment of a current mirror circuit according to the present invention. The present embodiment is different from the embodiment of FIG. 8 in that two voltage dividing circuits 7A and 7B similar to the voltage dividing circuit 7 of FIG. 8 are connected in cascade, two FET's $Q_{1A}$ and $Q_{1B}$ similar to the FET $Q_1$ of FIG. 8 are connected in cascade, and two FET's $Q_{2A}$ and $Q_{2B}$ similar to the FET $Q_2$ of FIG. 8 are connected in cascade. Thus, in the present embodiment, a high breakdown voltage operation is performed on the output side. It is needless to say that the present embodiment is identical with the embodiment of FIG. 8 in the remaining circuit connection other than the above-mentioned and in the circuit operation with respect to the remaining circuit connection.

Embodiment X

Figure 10:
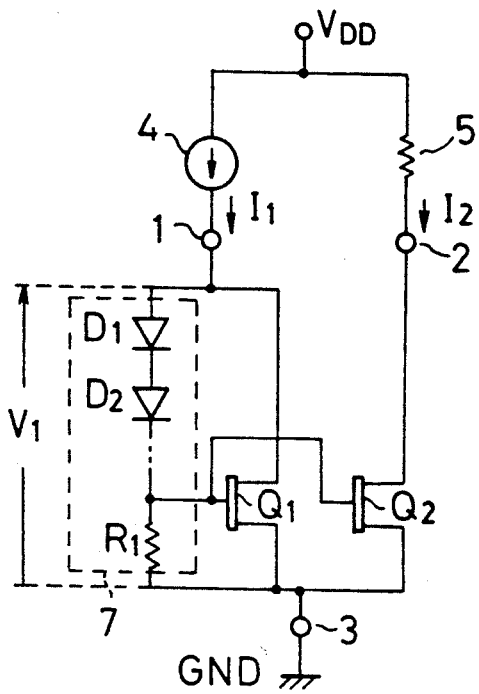

FIG. 10 is a circuit diagram showing a tenth embodiment of a current mirror circuit according to the present invention. The present embodiment is different from the embodiment of FIG. 8 in that level shift diodes $D_1$, $D_2$ and so on are substituted for the resistor $R_2$ of FIG. 8, and is identical with the embodiment of FIG. 8 in the remaining circuit connection other than the above-mentioned.

Each of the level shift diodes $D_1$, $D_2$ and so on which are connected in series, is a Schottky barrier diode or PN junction diode.

Now, let us express the level shift voltage due to the series-connected diodes $D_1$, $D_2$ and so on by $V_\beta$, and express the voltage appearing across the voltage dividing circuit 7 by $V_1$. When the resistor $R_1$ of the voltage dividing circuit 7 has a very large resistance value, a current flowing through the voltage dividing circuit 7 is negligibly small, as compared with the current $I_1$ flowing through the drain-source current path of the FET $Q_1$.

In a case where the gate-source voltage $V_{GS1}$ of the FET $Q_1$ equal to $(V_1-V_\beta)$, the threshold voltage $V_{th}$ having a negative value and the drain-source voltage $V_{DS1}$ of the FET $Q_1$ equal to $V_1$, satisfy the following relation:

$$V_{GS1}-V_{th}<V_{DS1}$$

that is, in a case where a relation $V_\beta > -V_{th}$ is satisfied, the FET $Q_1$ operates in a saturation region. Meanwhile, in a case where the drain-source voltage of the FET $Q_2$ has a sufficiently large value, the FET $Q_2$ operates in a saturation region.

Accordingly, the equations (26) and (27) which have been explained in the EMBODIMENT VIII, hold for the present embodiment. That is, the output current $I_2$ is equal to the input current $I_1$, and the present embodiment can operate similarly to the embodiment of FIG. 8.

Embodiment XI

Figure 11:
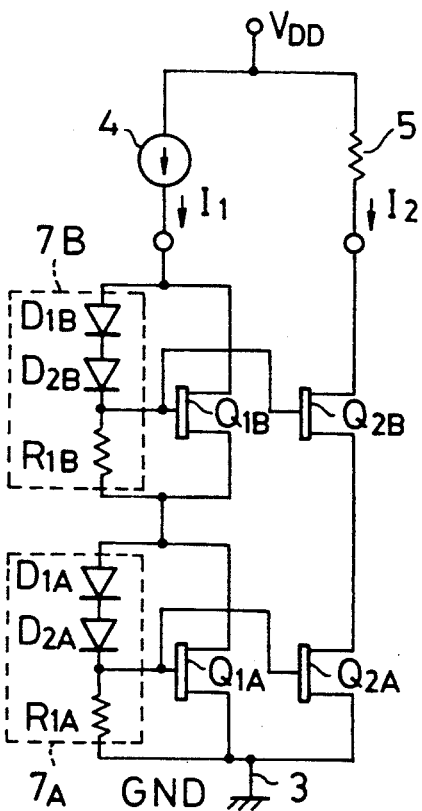

FIG. 11 is a circuit diagram showing an eleventh embodiment of a current mirror circuit according to the present invention. The present embodiment is different from the embodiment of FIG. 10 in that two voltage dividing circuits 7A and 7B similar to the voltage dividing circuit 7 of FIG. 10 are connected in cascade, two FET's $Q_{1A}$ and $Q_{1B}$ similar to the FET $Q_1$ of FIG. 10 are connected in cascade, and two FET's $Q_{2A}$ and $Q_{2B}$ similar to the FET $Q_2$ of FIG. 10 are connected in cascade. The present embodiment is identical with the embodiment of FIG. 10 in the remaining circuit connection other than the above-mentioned and in the circuit operation with respect to the remaining circuit connection. Thus, according to the present embodiment, a high breakdown voltage operation is performed on the output side.

Embodiment XII

Figure 12:
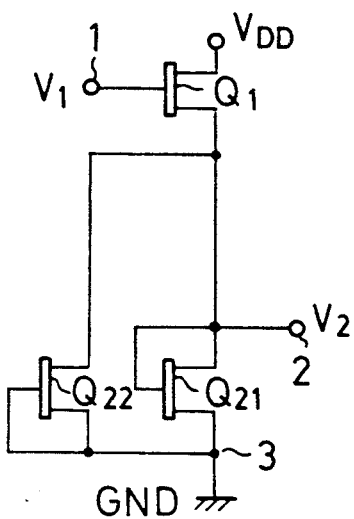
FIGS. 12 and 13 are circuit diagrams showing embodiments of a voltage converting circuit according to the present invention.

FIG. 12 is a circuit diagram showing an embodiment of a voltage converting circuit according to the present invention. The present embodiment has an input node 1, an output node 2 and a common node 3, and includes N-channel, depletion-type FET's $Q_1$, $Q_{21}$ and $Q_{22}$. The FET's $Q_1$, $Q_{21}$ and $Q_{22}$ are formed in an IC in close proximity to one another, and have the same threshold voltage $V_{th}$, the same gate length $L_G$ and the same gate width $W_G$. The threshold voltage $V_{th}$ has a negative value.

Referring to FIG. 12, the input node 1 applied with an input voltage $V_1$ is connected to the gate of the FET $Q_1$, the drain of which is connected to a power source having a positive supply voltage $V_{DD}$. The output node 2 for taking out an output voltage $V_2$ is connected to the source of the FET $Q_1$, and the drain of each of the FET's $Q_{21}$ and $Q_{22}$. The grounded common node 3 is connected to the source of each of the FET's $Q_{21}$ and $Q_{22}$. The gate of the FET $Q_{21}$ is shorted to the drain thereof, and the gate of the FET $Q_{22}$ is shorted to the source thereof.

Since the gate of the FET $Q_{21}$ is shorted to the drain thereof, the FET $Q_{21}$ operates in a linear region. Thus, a current $I_{21}$ flowing through the drain-source current path of the FET $Q_{21}$ is given by the following equation:

$$I_{21}=K(V_2^2-2V_{th}V_2) \tag{28}$$

In a case where the output voltage $V_2$ has a sufficiently large value, the FET $Q_{22}$ whose gate and source are shorted to each other, operates in a saturation region. Thus, a current $I_{22}$ flowing through the drain-source current path of the FET $Q_{22}$ is given by the following equation:

$$\begin{aligned}I_{22} &= K(V_{GS22} - V_{th})^2 \\ &= KV_{th}^2\end{aligned} \tag{29}$$

A current $I_2$ flowing through the parallel combination of the FET's $Q_{21}$ and $Q_{22}$ is the sum of the current $I_{21}$ and the current $I_{22}$. From the equations (28) and (29), we can obtain the current $I_2$ as follows:

$$\begin{aligned}I_2 &= I_{21} + I_{22} \\ &= K(V_2 - V_{th})^2\end{aligned}$$

From the above equation, we can obtain the following equation:

$$V_2 = \sqrt{\frac{I_2}{K}} + V_{th} \tag{30}$$

In a case where the drain-source voltage of the FET $Q_1$ has a sufficiently large value, the FET $Q_1$ operates in a saturation region. Now, let us suppose that any current does not flow in the output node 2 nor flows out therefrom. Then, a current $I_1$ flowing through the drain-source current path of the FET $Q_1$ is equal to the current $I_2$ and is expressed by the following equation:

$$\begin{aligned}I_1 &= K(V_{GS1} - V_{th})^2 \\ &= I_2\end{aligned} \tag{31}$$

Thus, the gate-source voltage $V_{GS1}$ of the FET $Q_1$ is given by the following equation:

$$V_{GS1} = \sqrt{\frac{I_2}{K}} + V_{th} \qquad (32)$$
$$= V_2$$

Hence, the input voltage $V_1$ is given as follows:

$$V_1 = V_{GS1} + V_2 = 2V_2$$

From the above equation, we can obtain the following equation:

$$V_2 = \tfrac{1}{2} \cdot V_1 \qquad (33)$$

As is evident from the above explanation, the voltage versus current characteristic of the parallel combination of the FET's $Q_{21}$ and $Q_{22}$ agrees with that of the FET $Q_1$. Hence, the present embodiment can produce the output voltage $V_2$ equal to one-half the input voltage $V_1$, independently of a change in threshold voltage $V_{th}$.

The operation limit of the present embodiment is determined by a maximum value $V_f$ of the gate voltage, at which the FET $Q_{21}$ can perform a transistor action normally, and is given by the following formula:

$$0 < V_2 < V_f$$

The voltage $V_f$ is determined in the same manner as in the embodiment of FIG. 1.

Even when the threshold voltage $V_{th}$ of the FET's $Q_1$, $Q_{21}$ and $Q_{22}$ is changed from a negative value to a positive value, and thus these FET's are N-channel, enhancement-type FET's having the same positive threshold voltage, the circuit configuration of FIG. 12 can operate normally as a voltage dividing circuit. This is because, in this case, the FET $Q_{22}$ whose gate and source are shorted to each other, is turned off, and each of the FET's $Q_1$ and $Q_{21}$ operates in a saturation region. In this case, also, the output voltage $V_2$ equal to one-half the input voltage $V_1$ is obtained.

Embodiment XIII

Figure 13:
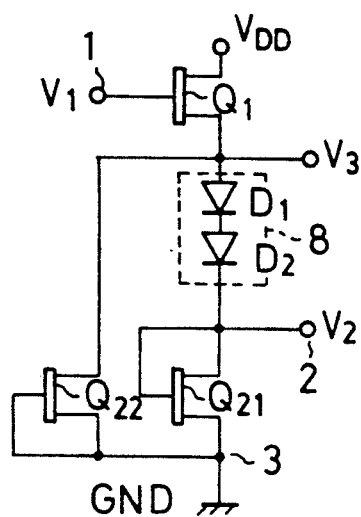

FIG. 13 is a circuit diagram showing another embodiment of a voltage converting circuit according to the present invention. The present embodiment is different from the embodiment of FIG. 12 in that a level shift circuit 8 is connected between the drain of the FET $Q_{22}$ and the drain of the FET $Q_{21}$, and two output voltages $V_2$ and $V_3$ are taken out from both ends of the level shift circuit 8. The present embodiment is identical with the embodiment of FIG. 12 in other points.

As can be seen from FIG. 13, the voltage $V_2$ from one end of the level shift circuit 8 is smaller than the voltage $V_3$ from the other end of the circuit 8. Since the small voltage $V_2$ is applied to the drain of the FET $Q_{21}$, the FET $Q_{21}$ operates surely in a linear region. Meanwhile, the relatively large voltage $V_3$ is applied to the drain of the FET $Q_{22}$. Thus, the FET $Q_{22}$ operates surely in a saturation region.

Accordingly, the equations (28) to (32) which have been explained in the EMBODIMENT XII, hold for the present embodiment. Now, let us express the voltage applied between both ends of the level shift circuit 8 by $V_\beta$. Then, the input voltage $V_1$ shown in FIG. 13 is given by the following equation:

$$V_1 = V_{GS1} + V_\beta + V_2$$
$$= 2V_2 + V_\beta$$

From the above equation, we can obtain the following equation:

$$V_2 = \tfrac{1}{2}(V_1 - V_\beta) \qquad (34)$$

Further, the output voltage $V_3$ is given by the following equation:

$$V_3 = V_2 + V_\beta \qquad (35)$$
$$= \tfrac{1}{2}(V_1 + V_\beta)$$

Each of diodes $D_1$ and $D_2$ for making up the level shift circuit 8 is a Schottky barrier diode or PN junction diode.

Embodiment XIV

Figure 14:
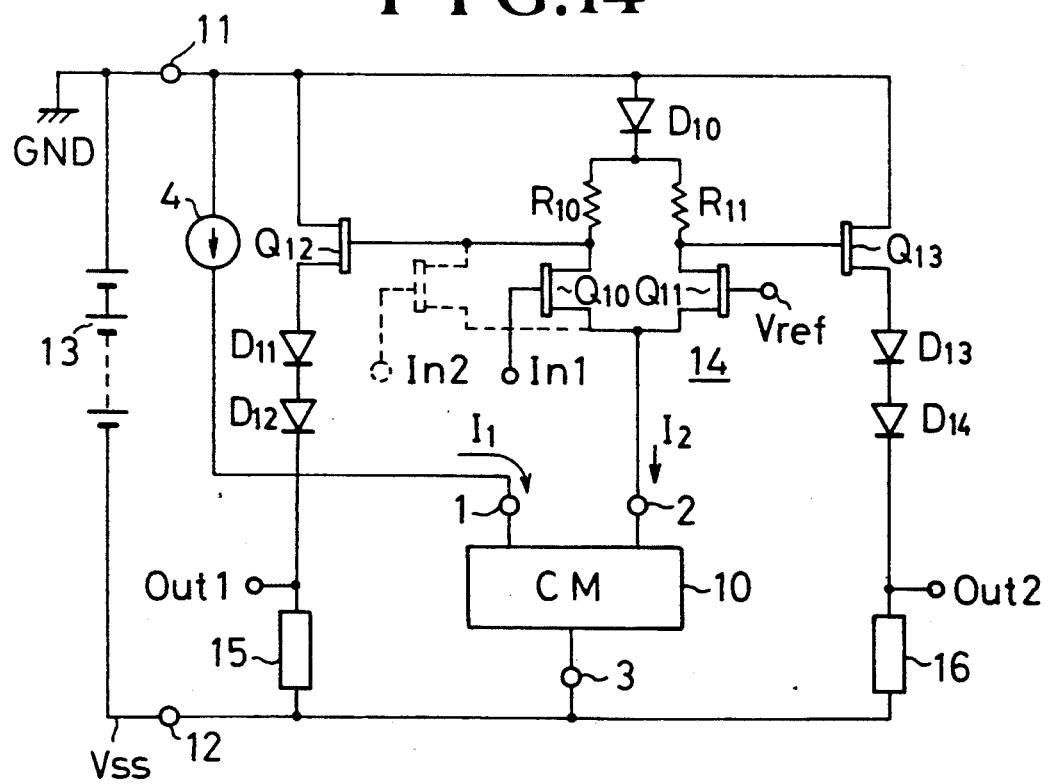
FIG. 14 is a circuit diagram showing an embodiment of a signal processing system according to the present invention.

FIG. 14 is a circuit diagram showing an embodiment of a signal processing system according to the present invention which embodiment includes a current mirror circuit 10.

One of the first to eleventh embodiments of a current mirror circuit according to the present invention, is used as the current mirror circuit 10. Referring to FIG. 14, the input node 1 of the current mirror circuit 10 is connected to a first-operation-potential supplying node 11 through the constant current source 4 for supplying the input current $I_1$ to the current mirror circuit 10, and the common node 3 of the current mirror circuit 10 is connected to a second-operation-potential supplying node 12. The constant current source 4 may be replaced by a resistor.

The first-operation-potential supplying node 11 is grounded, and a power source 13 for generating a predetermined operation voltage $V_{SS}$ is connected between the first-operation-potential supplying node 11 and the second-operation-potential supplying node 12.

The output node 2 of the current mirror circuit 10 is connected to differential pair transistors 14, which perform an analog-signal amplifying operation or digital-current steering operation in response to an analog or digital signal applied to an input node In 1. In order to perform a logical operation on the digital signal applied to the input node In 1 and a digital signal applied to another input node In 2, an additional transistor is connected as indicated by dotted lines in FIG. 14.

The differential pair transistors 14 may be formed of emitter-coupled bipolar transistors. In the present embodiment, however, the differential pair transistors 14 are formed of source-coupled FET's $Q_{10}$ and $Q_{11}$. The gate of the FET $Q_{11}$ is applied with a reference voltage $V_{ref}$.

The drain of the FET $Q_{10}$ is connected to one end of a resistor $R_{10}$ which serves as a load. The other end of the resistor $R_{10}$ is connected to the first-operation-potential supplying node 11 through a diode $D_{10}$. Further, the drain of the FET $Q_{11}$ is connected to one end of a resistor $R_{11}$ which serves as another load. The other end of the resistor $R_{11}$ is connected to the first-operation-potential supplying node 11 through the diode $D_{10}$. As has been explained in the EMBODIMENTS I to XI in detail, when the input current $I_1$ supplied from the constant current source 4 is precisely set, the output current $I_2$ of the current mirror circuit 10 can be precisely set without being affected by a change in threshold voltage of FET's included in the current mirror circuit 10. The threshold voltage of the FET's deviates unavoidably from a design target value on the basis of variations in manufacturing conditions of an IC or a change in ambient temperature. In spite of such deviation of the threshold voltage, the current $I_2$ flowing through the differential pair transistors 14 is precisely set. Accordingly, the output current of the differential pair transistors 14 can be precisely set. Thus, the voltage appearing across each of the load resistors $R_{10}$ and $R_{11}$ can be precisely determined from the resistance values of the resistors $R_{10}$ and $R_{11}$ and the current $I_2$.

Further, since the current $I_2$ flowing through the differential pair transistors 14 and the current mirror circuit 10 is precisely set, power consumption of these circuit parts 14 and 10 is precisely set. Hence, power supply means having a relatively small voltage margin can be used as the power source 13.

A voltage signal from the load resistor $R_{10}$ is sent to an output node Out 1 through an FET $Q_{12}$ and diodes $D_{11}$ and $D_{12}$. Meanwhile, a voltage signal from the load resistor $R_{11}$ is sent to another output node Out 2 through an FET $Q_{13}$ and diodes $D_{13}$ and $D_{14}$.

Circuit means 15 connected between the output node Out 1 and the second-operation-potential supplying node 12 acts as the source-follower load of the source-followered FET FET $Q_{12}$, and circuit means 16 connected between the output node Out 2 and the second-operation-potential supplying node 12 acts as the source-follower load of the source-followered FET $Q_{13}$. Each of the circuit means 15 and 16 can be formed of a constant current source or resistor.

The current mirror circuit 10, the FET's $Q_{10}$ to $Q_{13}$, the diodes $D_{10}$ to $D_{14}$, the resistors R 0 and $R_{11}$, and the circuit means 15 and 16 can be formed on the same IC chip. In a case where the IC chip is a GaAs chip, and the FET $Q_{10}$ to $Q_{13}$ are MESFET, the present embodiment can perform signal processing operations such as the amplification of a high-frequency signal, the high-speed amplification of a signal, and the steering of a digital current from a value to another value. The above signal processing operations can be utilized in various industrial fields such as analog communication, digital transmission, light communication, ultra-high-speed digital signal processing, and an ultra-high-speed super-computer.

Although various embodiments of the present invention have been explained in detail, the present invention is not limited to the embodiments, but changes and modifications can be made without departing from the spirit and scope of the invention.

For example, P-channel FET's can be used in all of the above-mentioned embodiments by inverting the polarity of the supply voltage, though N-channel FET's are used in the embodiments.

Further, like the multi-current mirror circuit shown in FIG. 6, a multi-current mirror circuit can be formed by adding one or more FET's for obtaining a plurality of output currents, to the output side of each of the embodiments of FIGS. 1 to 5 and FIGS. 7 to 11.

Further, the FET used in the present invention is not limited to a silicon MOSFET and a GaAs MESFET, but all kinds of FET's including a silicon MESFET, a high electron mobility transistor (HEMT) made of GaAs or other compound semiconductors, and a junction-type FET (JFET) made of silicon, can be used in the present invention.

Further, like the embodiment of FIG. 6, each of the embodiments of FIGS. 8 to 11 can operate as a minute constant current source circuit by connecting a source resistor between the common node 3 and the FET $Q_2$ or $Q_{2A}$. Furthermore, each of the embodiments of FIGS. 2 to 5 can operate as a minute constant current source circuit by connecting a source resistor between the common node 3 and the source of each of the FET's $Q_2$, $Q_{2A}$, $Q_{2AA}$ and $Q_{2AB}$, and the embodiment of FIG. 7 can operate as a minute constant current source circuit by connecting a source resistor between the common node 3 and the source of each of the FET's $Q_{21}$ and $Q_{22}$.

As has been explained in the foregoing, even in a case where at least two FET's included in a semiconductor circuit according to the present invention are of the depletion type, when the FET's have the same threshold voltage, the voltage versus current characteristic of one of the FET's agrees with that of the other FET. Thus, the electrical characteristics of the semiconductor circuit are scarcely affected by a change in threshold voltage of the FET's.

Further, the current mirror circuit included in a signal processing system according to the present invention is formed of the above semiconductor circuit. Accordingly, the output current of the current mirror circuit can be precisely set, without being affected by a change in threshold voltage of the FET's. The precisely set output current serves as the operation current of differential pair transistors. Thus, the output and power consumption of the differential pair transistors are scarcely affected by a change in threshold voltage of the FET's.

We claim:

1. A semiconductor circuit comprising first, second and third field effect transistors each one having a gate, source and drain and having a threshold of a same voltage value, the gate and drain of the first field effect transistor being electrically connected to each other, the gate and source of the second field effect transistor being electrically connected to each other, the sources of the first and second field effect transistors being connected to each other, the gate and the drain of the first field effect transistor and the drain of the second field effect transistor being connected to one of the gate and the source of the third field effect transistor, the first field effect transistor including a drain-source current path connected in parallel to a drain-source current path included in the second field effect transistor, and the gate of the third field effect transistor being applied with an input and one of the source and drain thereof providing an output, whereby a voltage versus current characteristic corresponding to the parallel connection of the drain-source current paths of the first and second field effect transistors is in agreement with a gate-source voltage versus drain-source current characteristic corresponding to that of the third field effect transistor independently of a change in threshold voltage of the first, second and third field effect transistors.

2. A semiconductor circuit according to claim 1, wherein the first, second and third field effect transistors are formed on a single integration circuit chip.

3. A semiconductor circuit according to claim 2, wherein the first, second and third field effect transistors are N-channel, depletion-type field effect transistors.

4. A current mirror circuit comprising:

an input node;
an output node;
a common node; and
first, second and third field effect transistors each one having a gate, source and drain and having a threshold of a same voltage value, the input node being electrically connected to the gate and drain of the first field effect transistor, the drain of the second field effect transistor and the gate of the third field effect transistor, the output node being electrically connected to the drain of the third field effect transistor, the common node being electrically connected to the source of the first field effect transistor, the gate and source of the second field effect transistor and the source of the third field effect transistor.

5. A current mirror circuit according to claim 4, further comprising a level shift circuit, one end of the level shift circuit being connected to the gate and drain of the first field effect transistor and the gate of the third field effect transistor, the other end of the level shift circuit being connected to the drain of the second field effect transistor and the input node.

6. A current mirror circuit according to claim 5, further comprising a fourth field effect transistor, the gate of the fourth field effect transistor being connected to the input node and the other end of the level shift circuit, the source of the fourth field effect transistor being connected to the drain of the third field effect transistor, the drain of the fourth field effect transistor being connected to the output node.

7. A current mirror circuit according to claim 6, wherein at least the first, second, third and fourth field effect transistors are formed on a single integration circuit chip.

8. A current mirror circuit according to claim 6, wherein the first, second, third and fourth field effect transistors are N-channel, depletion-type field effect transistors, the first transistor is disposed to operate in the linear region of its corresponding current-voltage characteristic curve and the second, third and fourth transistors are disposed to operate in the saturation region of their respective current-voltage characteristic curve.

9. A current mirror circuit according to claim 8, wherein the level shift circuit is comprised of one of a resistor, Schottky barrier diode and diode-connected field effect transistor or a combination thereof.

10. A current mirror circuit according to claim 5, wherein at least the first, second and third field effect transistors are formed on a single integration circuit chip.

11. A current mirror circuit according to claim 10, wherein the level shift circuit is comprised of one of a resistor, Schottky barrier diode and diode-connected field effect transistor or a combination thereof.

12. A current mirror circuit according to claim 4, wherein a resistor is connected between the source of the third field effect transistor and the common node.

13. A current mirror circuit according to claim 12, wherein at least the first, second and third field effect transistors are formed on a single integration circuit chip.

14. A current mirror circuit according to claim 4, wherein at least the first, second and third field effect transistors are formed on a single integration circuit chip.

15. A current mirror circuit according to claim 4, wherein the first field effect transistor is disposed to operate in the linear region of its corresponding current-voltage characteristic curve and the second and third field transistors are disposed to operate in the saturation region of their respective current-voltage characteristic curve.

16. A current mirror circuit according to claim 15, wherein the first, second and third field effect transistors are N-channel, depletion-type-field effect transistors.

17. A current mirror circuit according to claim 16, wherein at least the first, second and third field effect transistors are formed on a single integration circuit chip.

18. A current mirror circuit according to claim 17, wherein a resistor is connected between the source of the third field effect transistor and the common node.

19. A current mirror circuit comprising:
an input node;
an output node;
a common node; and
first, second, third and fourth field effect transistors each one having a gate, source and drain and having a threshold of a same voltage value, the input node being electrically connected to the drain of the first field effect transistor and the gate of the fourth field effect transistor, the output node being electrically connected to the drain of the fourth field effect transistor, the common node being electrically connected to the source of each of the first, second and third field effect transistors and connected to the gate of the third field effect transistor, and the gate of the first field effect transistor being electrically connected to the gate and drain of the second field effect transistor, the drain of the third field effect transistor and the source of the fourth field effect transistor.

20. A current mirror circuit according to claim 19, wherein the first, second, third and fourth field effect transistors are formed on a single integration circuit chip.

21. A current mirror circuit according to claim 19, wherein the first, second, third and fourth field effect transistors are N-channel, depletion-type field effect transistors, the first, third and fourth transistors are disposed to operate in the saturation region of their respective current-voltage characteristic curve and the second transistor is disposed to operate in its linear region of its corresponding current-voltage characteristic curve.

* * * * *